United States Patent
Lee et al.

(10) Patent No.: US 6,520,250 B2
(45) Date of Patent: Feb. 18, 2003

(54) FAN HOLDER

(75) Inventors: Dongyun Lee, Shenzhen (CN); Hsieh Kun Lee, Shenzhen (CN)

(73) Assignee: Foxconn Precision Components Co., Ltd., Taipei Hsien (TW)

(*) Notice: Subject to any disclaimer, the term of this patent is extended or adjusted under 35 U.S.C. 154(b) by 7 days.

(21) Appl. No.: 09/821,384

(22) Filed: Mar. 29, 2001

(65) Prior Publication Data

US 2002/0139518 A1 Oct. 3, 2002

(30) Foreign Application Priority Data

Feb. 23, 2001 (CN) .................................. 90202775 U

(51) Int. Cl.⁷ ............................................... H05K 7/20
(52) U.S. Cl. ..................... 165/121; 165/80.3; 361/697
(58) Field of Search ............... 165/80.3, 121, 165/185; 361/697

(56) References Cited

U.S. PATENT DOCUMENTS 5,495,392 A * 2/1996 Shen .......................... 165/121
5,677,829 A * 10/1997 Clemens ..................... 165/185
6,118,657 A * 9/2000 Clemens ..................... 165/80.3
6,311,766 B1 * 11/2001 Lin et al. .................... 165/121

* cited by examiner

Primary Examiner—Allen Flanigan
(74) Attorney, Agent, or Firm—Wei Te Chung

(57) ABSTRACT

A fan holder (10) for attaching a fan (30) to a heat sink (40) includes a base (11) defining an opening (18) therethrough, two pairs of hooks (14), two pairs of posts (16) around the opening, a pair of positioning blocks (22), and two pairs of slots (15) defined in the base. The hooks depend from the base, and engage in grooves (46) defined through fins (42) of the heat sink. The posts extend upwardly from the base, and are received in corresponding holes (32) of the fan. Each post has a resilient engaging portion (24) and a notch (25), which allow the engaging portion to elastically compress and firmly attach the fan on the fan holder. The positioning blocks are formed under the base, on opposite sides of the opening. The slots are adjacent the hooks, and allow easy disassembly of the fan holder from the heat sink.

12 Claims, 4 Drawing Sheets

FAN HOLDER

BACKGROUND OF THE INVENTION

1. Field of the Invention

The present invention relates to a holder, and particularly to a fan holder for attaching a fan to a heat sink.

2. Description of Related Art

Computer electronic devices such as central processing units (CPUs) generate a lot of heat during normal operation. This can deteriorate their operational stability and damage associated electronic equipment. Thus the heat must be removed quickly to ensure normal operation. A heat dissipation device is often attached to a top surface of a CPU, to remove heat therefrom.

Referring to FIG. 5, a conventional heat dissipation device 1 comprises a heat sink 2 and a fan 4. The fan 4 is secured on the heat sink 2 by screws 3 engaging with threads defined in fins of the heat sink 2.

Contemporary CPUs generate unprecedented amounts of heat, which has resulted in large height-to-width ratios of fins of modern heat sinks. The fins of such heat sinks are thin. Thus, in assembly, the fins of the heat dissipation device 1 are prone to deform. Later, during normal operation of the heat dissipation device 1, the screws are liable to disengage from the fins.

Furthermore, during securing of the screws 3 with the fins of the heat sink 2, fragments are often torn away from the fins. The fragments are deposited in spaces between the fins of the heat sink, thereby decreasing the efficiency of heat dissipation.

Examples of conventional heat dissipation devices are disclosed in Taiwan Patent Applications Nos. 85207163 and 86216714.

SUMMARY OF THE INVENTION

Accordingly, an object of the present invention is to provide a fan holder which can securely attach a fan to a heat sink.

Another object of the present invention is to provide a fan holder which has a simple structure.

In order to achieve the above-mentioned objects, a fan holder for attaching a fan to a heat sink in accordance with the present invention comprises a base defining an opening therethrough, two pair of hooks, two pairs of posts around the opening, a pair of positioning blocks, and two pairs of slots defined in the base. The hooks depend from the base, and engage in grooves defined through fins of the heat sink. The posts extend upwardly from the base, and are received in corresponding holes of the fan. Each post has a resilient engaging portion and a notch, which allow the engaging portion to elastically compress and firmly attach the fan on the fan holder. The positioning blocks are formed under the base, on opposite sides of the opening and perpendicular to the hooks. The slots are adjacent the hooks, and allow easy disassembly of the fan holder from the heat sink.

Other objects, advantages and novel features of the invention will become more apparent from the following detailed description of the preferred embodiment when taken in conjunction with the accompanying drawings.

DETAILED DESCRIPTION OF THE PREFERRED EMBODIMENT

Figure 1:
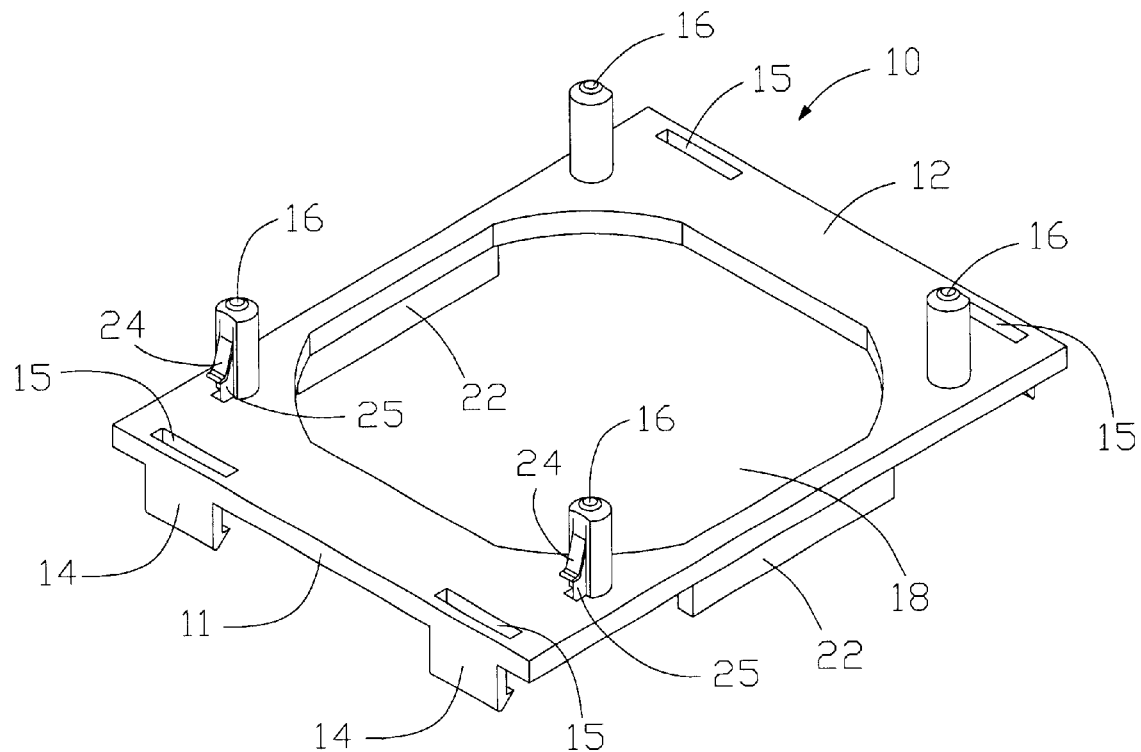
FIG. 1 is a perspective view of a fan holder of the preferred embodiment of the present invention.

Reference will now be made to the drawing figures to describe the preferred embodiment of the present invention in detail.

Figure 2:
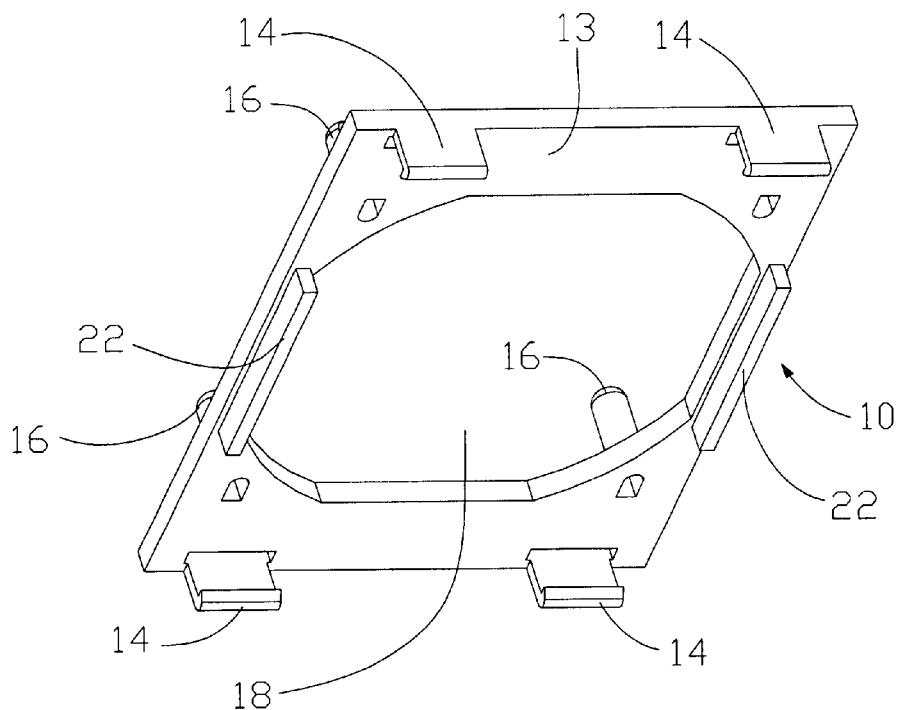
FIG. 2 is a perspective view of the fan holder of FIG. 1, viewed from another aspect.

Referring to FIGS. 1–2, a fan holder 10 of the present invention comprises a rectangular base 11. The base 11 has a top surface 12, and a bottom surface 13 opposite to the top surface 12. An opening 18 is defined in a center of the base 11. Two pairs of opposing hooks 14 respectively depend from opposite side edges of the base 11, each hook being near a respective corner of the base 11. Four slots 15 are respectively defined in the base 11, each slot 15 being disposed adjacent and inwardly from the corresponding hook 14. A pair of elongate positioning blocks 22 is formed on the bottom surface 13 of the base 11, on opposite sides of the opening 18 respectively. The positioning blocks 32 are generally perpendicular to the hooks 14.

Two pairs of hollow posts 16 extend upwardly from the top surface 12 of the base 11, each post 16 being disposed between a respective corner of the base 11 and the opening 18. Each post 16 has a resilient engaging portion 24 extending downwardly and outwardly from an upper portion thereof. A notch 25 is defined in each post 16, opposite the engaging portion 24.

Figure 3:
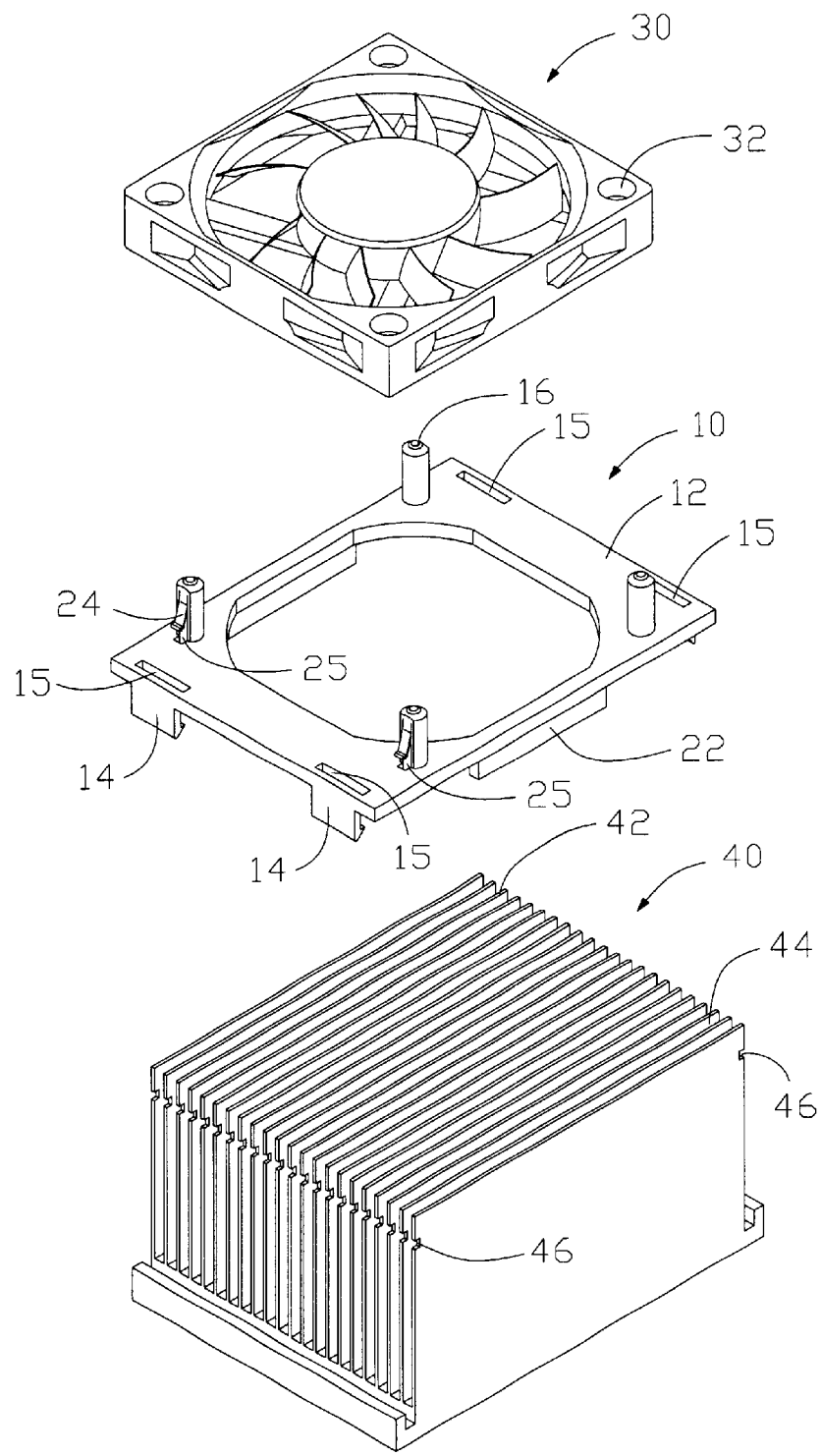
FIG. 3 is an exploded view of the fan holder of the present invention, for securing a fan to a heat sink.

FIG. 3 is an exploded view of the fan holder 10 of the present invention, for attaching a fan 30 to a heat sink 40. Four holes 32 are respectively defined in four corners of the fan 30, corresponding to the posts 16 of the fan holder 10. The heat sink 40 has a plurality of upwardly extending fins 42, with spaces 44 defined between adjacent fins 42. A pair of grooves 46 is defined through ends of upper portions of the fins 42, the grooves 46 being disposed at opposite sides of the heat sink 40.

Figure 4:
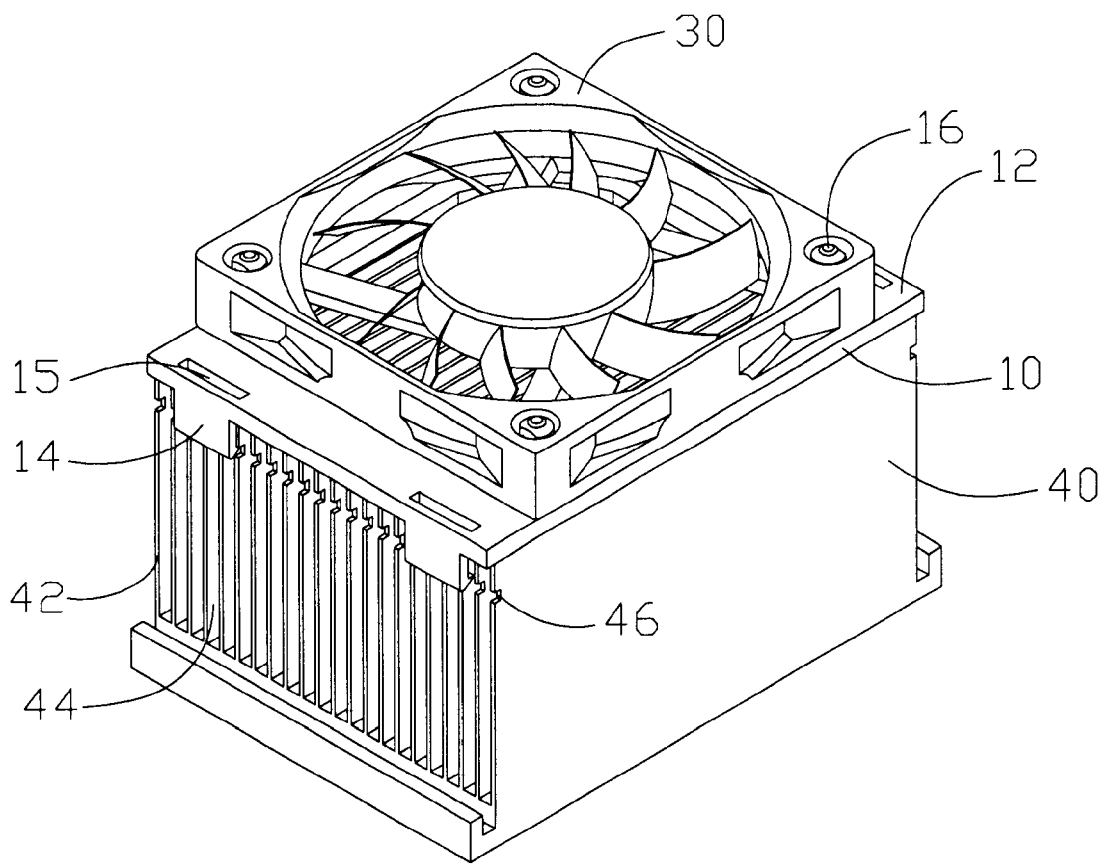
FIG. 4 is an assembled view of FIG. 3.
Figure 5:
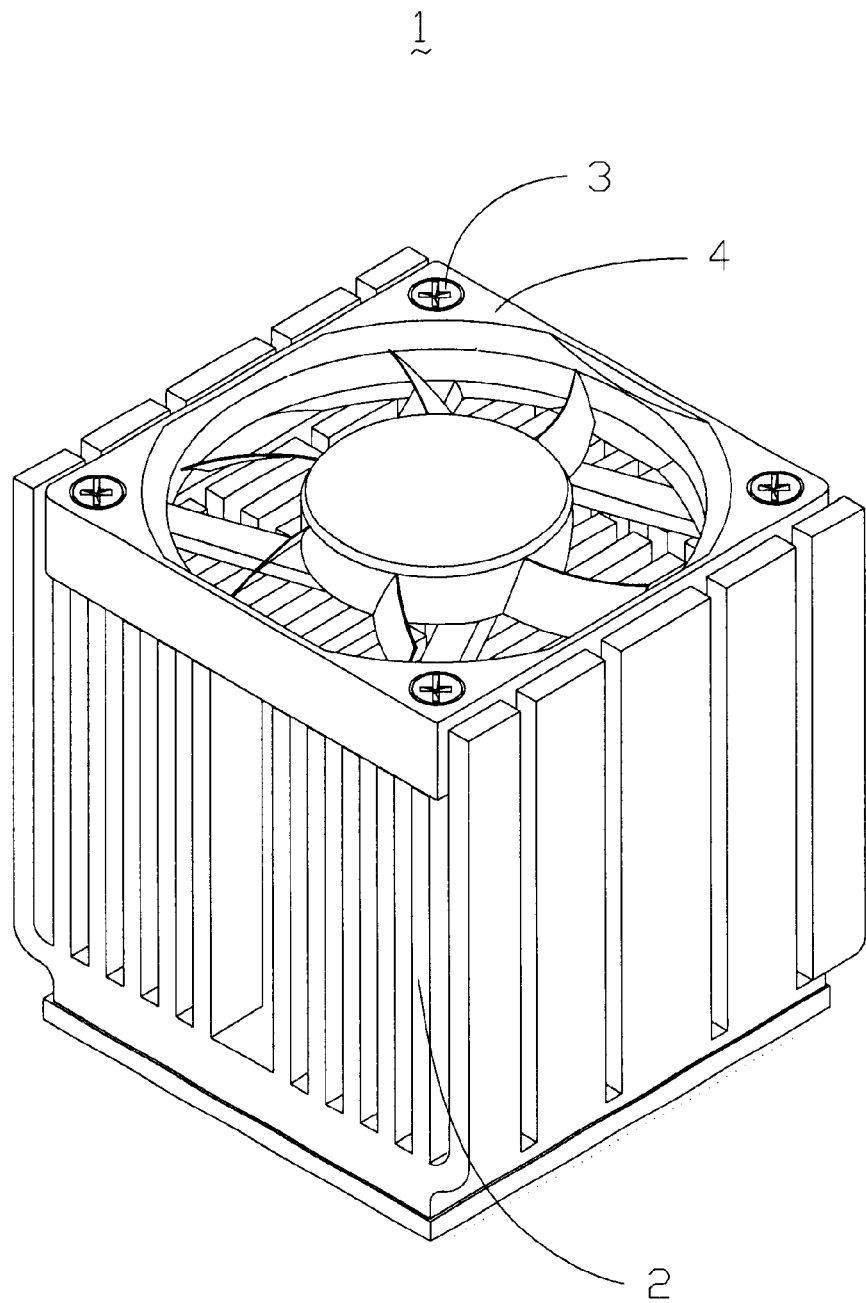
FIG. 5 is an assembled view of a fan attached to a heat sink by a conventional fan holder.

Referring also to FIG. 4, in assembly, the fan holder 10 is placed on the heat sink 40. The positioning blocks 22 of the fan holder 10 are located above two outmost spaces 44 of the heat sink 40 respectively. The fan holder 10 is pressed downwardly until the hooks 14 thereof engage in the grooves 46 of the heat sink 40. The positioning blocks 22 are received in the outmost spaces 44, with opposite sides of each positioning block 22 abutting against adjacent fins 42 of the heat sink 44. The fan 30 is then placed on the fan holder 10, with the holes 32 of the fan 30 receiving the posts 16 of the fan holder 10. The fan 30 is pressed downwardly until it contacts the top surface 12 of the fan holder 10. The engaging portions 24 of the posts 16 are elastically compressed and tightly abut against the fan 30 in the holes 32, thereby firmly attaching the fan 10 on the fan holder 32. Thus the fan holder 10 securely attaches the fan 30 on the heat sink 40.

In disassembly, the fan 30 is detached from the fan holder 32. A tool (not shown) is then inserted in one slot 15 of the fan holder 32, and is pressed inwardly and downwardly. This causes the hooks 14 on one side of the fan holder 10 to disengage from the corresponding groove 46 of the heat sink 40. Thereupon the fan holder 32 is easily detached from the heat sink 40.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fan holder for attaching a fan to a heat sink, comprising:

a hollow base having a top surface and a bottom surface;

a plurality of posts extending from the top surface of the base, each post having a resilient engaging portion adapted for resiliently engaging with the fan, the resilient engaging portion extending downwardly and outwardly from a top end of the post, each post defining a notch between a corresponding engaging portion and a corresponding post; and engaging means formed on the bottom surface of the base for engaging with the heat sink and thereby attaching the fan to the heat sink.

2. The fan holder as claimed in claim 1, wherein the engaging means comprises a plurality of hooks depending from the bottom surface of the base.

3. The fan holder as claimed in claim 2, wherein at least one slot is defined in the base, the slot being adjacent a corresponding hook.

4. The fan holder as claimed in claim 1, wherein at least one positioning block is formed on the bottom surface of the base perpendicular to the engaging means.

5. A heat dissipation device comprising:

a heat sink with a plurality of upwardly extending fins, the fins defining a plurality of grooves;

a fan with a plurality of holes defined therein; and a holder attaching the fan to the heat sink, the holder comprising:
      a hollow base;
      a plurality of posts securely received in the holes of the fan; and
      a plurality of hooks engaging with the corresponding grooves, wherein at least one slot is defined in the base adjacent a corresponding hook.

6. The heat dissipation device as claimed in claim 5, wherein each post has a resilient engaging portion resiliently engaging with the fan and thereby fixing the fan to the holder.

7. The heat dissipation device as claimed in claim 6, wherein each post defines a notch opposite a corresponding engaging portion.

8. The heat dissipation device as claimed in claim 5, wherein at least one positioning block is formed on the base for being received in a space between fins of the heat sink.

9. A heat dissipation device comprising:

a heat sink having a plurality of fins;

a fan having a plurality of mounting holes defined therein; and a fan holder located between the heat sink and the fan and mounting the fan to the heat sink, the fan holder comprising:
      a hollow base;
      a plurality of posts extending from the base into the mounting holes, each post forming an engaging portion, said engaging portions resiliently engaging with the fan and thereby fixing the fan to the holder;
      a plurality of hooks extending from the base toward the heat sink to engage with the heat sink and thereby fix the holder and the heat sink together, and
      at least one positioning block extending from the base into a space between two adjacent fins, the at least one positioning block being perpendicular to the hooks.

10. The heat dissipation device as claimed in claim 9, wherein a plurality of grooves is defined in the fins, and the hooks engage in the grooves.

11. The heat dissipation device as claimed in claim 9, wherein opposite sides of the at least one positioning block abut against adjacent fins.

12. The heat dissipation device as claimed in claim 9, wherein the at least one positioning block extends from a side of the base which is perpendicular to sides from which the hooks extend.

* * * * *